United States Patent
Li et al.

(10) Patent No.: US 9,461,340 B2
(45) Date of Patent: Oct. 4, 2016

(54) BATTERY, BATTERY ASSEMBLY, AND USER EQUIPMENT

(71) Applicant: Huawei Device Co., Ltd., Shenzhen (CN)

(72) Inventors: Changqi Li, Xi'an (CN); Jianbing Yu, Xi'an (CN); Kelin Li, Xi'an (CN)

(73) Assignee: Huawei Device Co., Ltd., Shenzhen (CN)

( * ) Notice: Subject to any disclaimer, the term of this patent is extended or adjusted under 35 U.S.C. 154(b) by 442 days.

(21) Appl. No.: 13/849,901

(22) Filed: Mar. 25, 2013

(65) Prior Publication Data

US 2013/0216886 A1 Aug. 22, 2013

Related U.S. Application Data

(63) Continuation of application No. PCT/CN2011/072946, filed on Apr. 18, 2011.

(51) Int. Cl.
*H02J 7/00* (2006.01)
*H01M 10/42* (2006.01)
(Continued)

(52) U.S. Cl.
CPC ....... *H01M 10/4257* (2013.01); *H01M 2/1027* (2013.01); *H01M 2/204* (2013.01);
(Continued)

(58) Field of Classification Search
CPC ..... Y02E 60/12; H02J 7/0047; H02J 7/0042; H02J 7/0045; G01R 31/3648; G01R 31/3651; G01R 31/3624; H01M 10/44; H01M 10/46
USPC .................................................. 320/107, 132
See application file for complete search history.

(56) References Cited

U.S. PATENT DOCUMENTS 6,171,138 B1 * 1/2001 Lefebvre ............. H04M 1/0262
429/97
6,515,450 B1 * 2/2003 Kaiho ................. H01M 2/1022
320/112

(Continued)

FOREIGN PATENT DOCUMENTS

CN 2612083 Y 4/2004
CN 101325271 A 12/2008
(Continued)

OTHER PUBLICATIONS

Foreign Communication From a Counterpart Application, Japanese Application No. 2013-530535, Japanese Office Action dated Mar. 18, 2014, 4 pages.

(Continued)

*Primary Examiner* — Richard Isla Rodas
*Assistant Examiner* — Mohammed J Sharief
(74) *Attorney, Agent, or Firm* — Conley Rose, P.C.; Grant Rodolph; Adam J. Stegge (57) ABSTRACT

A battery, a battery assembly, and a user equipment are disclosed. The battery includes a circuit board and a cell. The circuit board includes a first contact, a second contact, a third contact, a fourth contact, a battery management module, and a control switch. The first contact reports a capacity of the cell in the battery, or in the battery and a cascaded battery to an upper-level battery or an electricity load; the second contact receives and output the capacity of the cell in the cascaded battery; when the control switch is opened, the third contact is connected to the cell in the battery to charge or discharge the cell in the battery; when the control switch is closed, the fourth contact is connected to the third contact; and the battery management module triggers opening or closing of the control switch.

15 Claims, 7 Drawing Sheets

(51) Int. Cl.
| | |
|---|---|
| H01M 10/44 | (2006.01) |
| H01M 10/48 | (2006.01) |
| H01M 2/20 | (2006.01) |
| H01M 2/30 | (2006.01) |
| H01M 10/04 | (2006.01) |
| H01M 2/10 | (2006.01) |
| H01M 2/02 | (2006.01) |
| G01R 31/36 | (2006.01) |

(52) U.S. Cl.
CPC ......... *H01M 2/30* (2013.01); *H01M 10/0436* (2013.01); *H01M 10/425* (2013.01); *H01M 10/441* (2013.01); *H01M 10/482* (2013.01); *H02J 7/007* (2013.01); *H02J 7/0032* (2013.01); *G01R 31/3658* (2013.01); *H01M 2/0215* (2013.01); *H01M 10/486* (2013.01); *H01M 2010/4278* (2013.01); *H01M 2220/30* (2013.01); *H02J 7/0013* (2013.01)

(56) References Cited

U.S. PATENT DOCUMENTS

| | | | | |
|---|---|---|---|---|
| 8,547,068 | B2* | 10/2013 | Kim | 320/136 |
| 8,703,328 | B2* | 4/2014 | Villarreal | 429/170 |
| 2006/0170396 | A1* | 8/2006 | Ha | H01M 2/1061 320/116 |
| 2007/0210746 | A1* | 9/2007 | Tanjou | H02J 7/0021 320/112 |
| 2008/0074080 | A1* | 3/2008 | Luo et al. | 320/132 |
| 2008/0213652 | A1* | 9/2008 | Scheucher | B60L 8/00 429/62 |
| 2009/0071675 | A1 | 3/2009 | Hanawa et al. | |
| 2009/0096419 | A1 | 4/2009 | White et al. | |
| 2009/0208821 | A1 | 8/2009 | Kosugi et al. | |
| 2010/0283430 | A1 | 11/2010 | Chaturvedi et al. | |
| 2011/0003182 | A1* | 1/2011 | Zhu | H01M 10/482 429/50 |
| 2011/0059342 | A1* | 3/2011 | Lee et al. | 429/93 |
| 2011/0068745 | A1 | 3/2011 | Milios | |
| 2011/0076530 | A1 | 3/2011 | Miyamoto et al. | |
| 2011/0163728 | A1* | 7/2011 | Sutardja et al. | 320/163 |
| 2012/0056586 | A1 | 3/2012 | Sim et al. | |
| 2012/0183823 | A1* | 7/2012 | Von Borck | H01M 2/1061 429/81 |
| 2012/0313439 | A1 | 12/2012 | Yamaguchi et al. | |
| 2013/0002016 | A1 | 1/2013 | Furukawa et al. | |

FOREIGN PATENT DOCUMENTS

| | | |
|---|---|---|
| CN | 201466159 U | 5/2010 |
| CN | 101826643 A | 9/2010 |
| EP | 2339717 A1 | 6/2011 |
| JP | 2005056654 A | 3/2005 |
| JP | 2007234264 A | 9/2007 |
| JP | 2007330069 A | 12/2007 |
| JP | 2011182623 A | 9/2011 |
| JP | 2012059703 A | 3/2012 |
| WO | 2007007655 A1 | 1/2007 |
| WO | 2010044290 A1 | 4/2010 |
| WO | 2010117498 A2 | 10/2010 |
| WO | 2010129825 A1 | 11/2010 |
| WO | 2012053426 A1 | 4/2012 |

OTHER PUBLICATIONS

Foreign Communication From a Counterpart Application, Japanese Application No. 2013-530535, English Translation of Japanese Office Action dated Mar. 18, 2014, 5 pages.
Partial English Translation and Abstract of Japanese Patent Application No. JP2007234264A, Mar. 6, 2015, 23 pages.
Foreign Communication From a Counterpart Application, Japanese Application No. 2013-530535, Japanese Notice of Allowance dated Jan. 22, 2015, 3 pages.
Foreign Communication From a Counterpart Application, PCT Application PCT/CN2011/072946, International Search Report & Written Opinion dated Jan. 19, 2012, 10 pages.
Foreign Communication From a Counterpart Application, PCT application PCT/CN2011/072946, English Translation of International Search Report dated Jan. 19, 2012, 4 pages.
Foreign Communication From a Counterpart Application, European Application No. 11746875.1 Extended European Search Report dated Jul. 18, 2013, 5 pages.
Foreign Communication From a Counterpart Application, Chinese Application No. 201180000354.0, Chinese Search Report dated Aug. 29, 2013, 5 pages.
Foreign Communication From a Counterpart Application, European Application No. 11746875.1, Extended European Search Report dated May 12, 2015, 4 pages.

* cited by examiner

BATTERY, BATTERY ASSEMBLY, AND USER EQUIPMENT

CROSS-REFERENCE TO RELATED APPLICATION

The present application is a continuation of International Application No. PCT/CN2011/072946, filed on Apr. 18, 2011, which is incorporated herein by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

Embodiments of the present invention relate to battery technologies, and in particular, to a battery, a battery assembly, and a user equipment.

BACKGROUND

At present, in battery technologies, a capacity of a single battery cannot be increased significantly. In addition, with the development of integrated circuit (IC) technologies, because an IC operating speed becomes faster and faster, power consumption increasingly grows. As a result, power consumption of a hand-held terminal, especially a wireless communication product, cannot be greatly reduced, and a service duration of a battery of the hand-held terminal is short, thereby failing to meet a demand of a user for a long working duration in a specific condition.

To solve the foregoing problems, the following two manners are mainly used currently. In a first manner, on a precondition of not changing the energy density of a battery, a volume and weight of the battery are increased, so as to prolong a working duration of the battery. In a second manner, batteries of two models are designed for a same hand-held terminal, and these batteries of two models have different capacities, where a battery of a smaller-capacity model has a shorter working duration, is of a smaller size, and is portable; while a battery of a larger-capacity model has a longer working duration and is of a larger size.

In a process of implementing the present invention, the inventor finds that the prior art has at least the following problems: In the first manner, the battery is not suitable to be applied to a portable and miniaturized hand-held terminal; while in the second manner, the hand-held terminal needs to be shut down and restarted during a battery switch, which adds a battery switch duration, and is inconvenient for the user to use.

SUMMARY

Embodiments of the present invention provide a battery, a battery assembly, and a user equipment, so as to solve problems in the prior art that a battery is not suitable to be applied to a portable and miniaturized user equipment and a switch duration is relatively long, so that it is implemented that a battery capacity may be flexibly configured according to different application scenarios of a user.

An embodiment of the present invention provides a battery, including: a circuit board and a cell, where the circuit board includes: a first contact, a second contact, a third contact, a fourth contact, a battery management module, and a control switch; the first contact is connected to the battery management module and is electrically connected to an upper-level battery or is connected to an electricity load; and is configured to report a capacity of the cell in the battery, or the capacity of the cell in the battery and a capacity of a cell in a cascaded battery behind the battery to the upper-level battery or the electricity load; the second contact is connected to the battery management module and is electrically connected to a lower-level battery; and is configured to receive the capacity of the cell in the cascaded battery behind the battery, and output the capacity of the cell in the cascaded battery behind the battery to the battery management module; the third contact is connected to the upper-level battery or the electricity load, and is configured to, when the control switch is opened, connect to the cell in the battery, to charge or discharge the cell in the battery; the fourth contact is connected to the lower-level battery, and is configured to, when the control switch is closed, connect to the third contact, so that the lower-level battery performs corresponding processing; and the battery management module is connected to the cell, the first contact, the second contact, and the control switch in the battery, and is configured to trigger, according to the acquired capacity of the cell in the battery and/or the acquired capacity of the cell in the cascaded battery behind the battery, opening or closing of the control switch.

An embodiment of the present invention provides a battery assembly, including: a bottom housing, a first contact set, a polyoxymethylene fastening block, an upper housing, a second contact set, a first slide slot, and a second slide slot, where the first contact set is disposed on the upper housing, and includes four raised gold-plated contacts, which are connected to a second contact, a fourth contact, a sixth contact, and an eighth contact respectively; the second contact set is disposed on the bottom housing, and includes four recessed gold-plated contacts, which are connected to a first contact, a third contact, a fifth contact, and a seventh contact respectively; and the first slide slot is disposed on the upper housing, the second slide slot is disposed on the bottom housing, and the first slide slot and the second slide slot are complementary to each other.

An embodiment of the present invention provides a user equipment, including at least one battery assembly described above.

An embodiment of the present invention provides a user equipment, including an electricity load, and further including the foregoing battery assembly.

In the battery, the battery assembly, and the user equipment according to the embodiments of the present invention, the battery management module disposed on the battery triggers, according to the acquired capacity of the cell in the cascaded battery behind the battery and the acquired capacity of the cell in the current battery, opening or closing of the control switch, so as to connect the third contact and the cell of the battery or connect the third contact and the fourth contact, thereby implementing charging/discharging of the current battery or charging/discharging of any one of cascaded batteries behind the battery. In this way, the problems in the prior art that the battery is not suitable to be applied to the portable and miniaturized user equipment and the switch duration is relatively long are solved, and the battery capacity may be flexibly configured according to different application scenarios of the user.

BRIEF DESCRIPTION OF THE DRAWINGS

To describe the technical solutions in the embodiments of the present invention more clearly, the following briefly introduces accompanying drawings required for describing the embodiments. Apparently, the accompanying drawings in the following description show merely some embodiments of the present invention, and persons of ordinary skill in the art may further obtain other drawings according to these accompanying drawings without creative efforts.

DETAILED DESCRIPTION

To make the objectives, technical solutions, and advantages of the embodiments of the present invention more comprehensible, the following clearly describes the technical solutions in the embodiments of the present invention with reference to the accompanying drawings in the embodiments of the present invention. Apparently, the embodiments to be described are merely part rather than all of the embodiments of the present invention. All other embodiments obtained by persons of ordinary skill in the art based on the embodiments of the present invention without creative efforts shall fall within the protection scope of the present invention.

Figure 1:
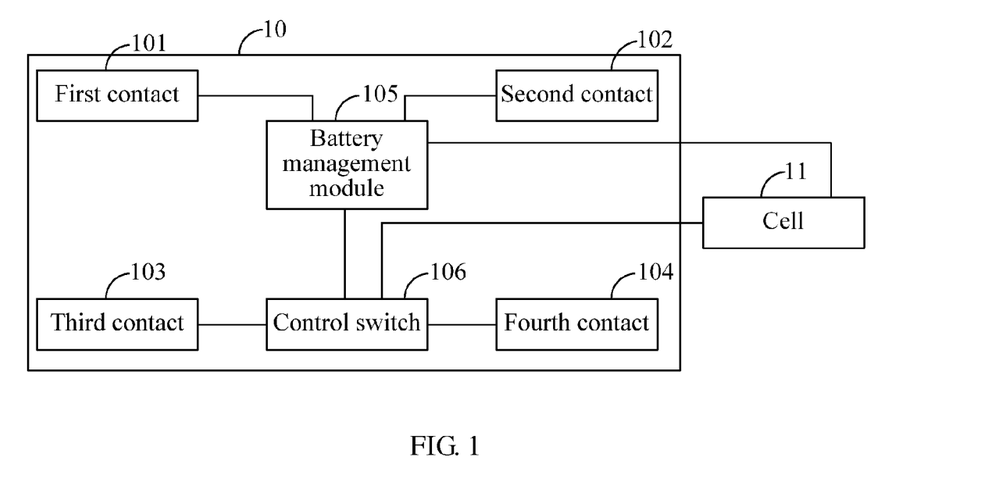
FIG. 1 is a schematic structural diagram of an embodiment of a battery according to the present invention.

FIG. 1 is a schematic structural diagram of an embodiment of a battery according to the present invention. As shown in FIG. 1, the battery in this embodiment includes a circuit board 10 and a cell 11, wherein the circuit board 10 includes a first contact 101, a second contact 102, a third contact 103, a fourth contact 104, a battery management module 105, and a control switch 106.

Specifically, the first contact 101 is connected to the battery management module 105 and is electrically connected to an upper-level battery or is connected to an electricity load, which is configured to report a capacity of the cell 11 of the battery, or a capacity of the cell 11 in the battery and a capacity of a cell in a cascaded battery behind the battery to the upper-level battery or the electricity load. The second contact 102 is connected to the battery management module 105 and is electrically connected to a lower-level battery, which is configured to receive the capacity of the cell in the cascaded battery behind the battery and output the capacity of the cell in the cascaded battery behind the battery to the battery management module 105. The third contact 103 is connected to the upper-level battery or the electricity load, and is configured to, when the control switch 106 is opened, connect to the cell 11 in the battery, to charge or discharge the cell 11 in the battery. The fourth contact 104 is connected to the lower-level battery, and is configured to, when the control switch 106 is closed, connect to the third contact 103, so that the lower-level battery performs corresponding processing. The battery management module 105 is connected to the cell 11, the first contact 101, the second contact 102, and the control switch 106, and is configured to trigger, according to the acquired capacity of the cell 11 and/or the acquired capacity of the cell of the cascaded battery behind the battery, opening or closing of the control switch 106.

The control switch 106 may be an analog switch or a small-size relay.

In this embodiment, the management module disposed on the battery triggers, according to the acquired capacity of the cell in the cascaded battery behind the battery and the acquired capacity of the cell of the current battery, opening or closing of the control switch, so as to connect the third contact and the cell of the battery or connect the third contact and the fourth contact, thereby implementing charging/discharging of the current battery or charging/discharging of any one of cascaded batteries behind the battery. In this way, problems in the prior art that a battery is not suitable to be applied to a portable and miniaturized user equipment and a switch duration is relatively long are solved, and a battery capacity may be flexibly configured according to different application scenarios of a user.

Further, in another embodiment of the present invention, on the basis of the embodiment shown in FIG. 1, a case that the battery management module 105 has not detected any external charging voltage is taken as an example to introduce the technical solution of this embodiment in detail. In this embodiment, the electricity load may be cascaded to at least one battery. Specifically, taking a battery to which the electricity load is directly cascaded as an example, when the battery management module 105 has not detected any external charging voltage, it indicates that the battery is in a discharging state. In this case, the battery may have the following several working manners.

In a first manner, when the battery management module 105 determines that the capacity of the cell 11 is greater than or equal to a first preset capacity, it indicates that the battery is capable of supplying power to the electricity load; then, the battery management module 105 triggers opening of the control switch 106, so as to connect the third contact 103 and the cell 11; because the third contact 103 is connected to the electricity load, the cell 11 may be connected to the electricity load through the third contact 103 when the third contact 103 is connected to the cell 11, so that it is implemented that the cell 11 in the battery supplies power to the electricity load.

In a second manner, when the battery management module 105 determines that the capacity of the cell 11 is less than or equal to a first preset capacity and has acquired the capacity of the cell in the cascaded battery behind the battery, it indicates that the capacity of the cell 11 in the battery is insufficient and the cell 11 cannot supply power to the electricity load; then, the battery management module 105 triggers closing of the control switch 106, so as to connect the third contact 103 and the fourth contact 104, thereby implementing that a cell in any one of the cascaded batteries behind the battery supplies power to the electricity load. For example, after the battery management module

105 triggers closing of the control switch 106, the third contact 103 is connected to the fourth contact 104, that is, the fourth contact 104 in the current battery is connected to the third contact in the lower-level battery, so that it is implemented that the cell in any one of the cascaded batteries behind the battery supplies power to the electricity load. It should be noted that, whether the capacity of the cell in the cascaded battery behind the battery is sufficient, that is, whether the cell is capable of supplying power to the electricity load, is not taken into consideration in this case.

In a third manner, when the battery management module 105 determines that the capacity of the cell 11 is less than or equal to a first preset capacity and does not acquire the capacity of the cell in the cascaded battery behind the battery, it indicates that the battery in this embodiment is a last-level battery of the user equipment, and it also indicates that no battery in the user equipment is capable of supplying power to the electricity load; then, the battery management module 105 outputs a battery depletion signal through the first contact, and transmits the battery depletion signal through second contacts and first contacts of batteries of previous few levels one by one, until the user equipment receives the battery depletion signal and performs a shutdown operation according to the battery depletion signal.

Furthermore, in still another embodiment of the present invention, on the basis of the embodiment shown in FIG. 1, a case that the battery management module 105 has detected an external charging voltage is taken as an example to introduce the technical solution of this embodiment in detail. In this embodiment, when the battery management module 105 has detected the external charging voltage, it indicates that the battery is in a charging state. In this case, the battery may have the following several working manners.

In a first manner, when the battery management module 105 determines that a capacity of a cell in any one of the cascaded batteries behind the battery is less than a second preset capacity, that is, when a capacity of a cell in at least one of the cascaded batteries behind the battery is insufficient, the battery management module 105 triggers closing of the control switch 106, so as to connect the third contact 103 and the fourth contact 104, thereby implementing preferentially charging of the cell with insufficient capacity in the cascaded batteries behind the battery. It should be noted that, whether the capacity of the cell 11 is sufficient is not taken into consideration here.

In a second manner, when the battery management module 105 determines that the capacity of the cell 11 is less than a second preset capacity and capacities of cells in the cascaded batteries behind the battery are all greater than or equal to the second preset capacity, that is, when the capacities of the cells in the cascaded batteries behind the battery are all sufficient, the battery management module 105 triggers opening of the control switch 106, so as to connect the third contact 103 and the cell 11, thereby implementing charging of the cell 11 in the current battery.

In a third manner, when the battery management module 105 determines that the capacity of the cell 11 is greater than or equal to a second preset capacity, it indicates that the capacity of the cell 11 is sufficient; if the battery is directly connected to the electricity load, a charging completion signal is output to the user equipment through the first contact 101, so as to notify the user equipment that charging of all batteries on the user equipment is completed; if the battery is electrically connected to an upper-level battery, a charging completion signal is output to the upper-level battery through the first contact 101; after receiving the charging completion signal through the second contact, the upper-level battery transmits the charging completion signal to its battery management module, and then the battery management module triggers opening of its control switch, so as to disconnect the third contact and the fourth contact, thereby disconnecting the upper-level battery and the current battery, and meanwhile, further implementing charging of a cell in a battery in an upper-level battery assembly, where its implementation principle is the same as a charging principle of the first cell 11 in the current battery, and details are not repeatedly described here.

Figure 2:
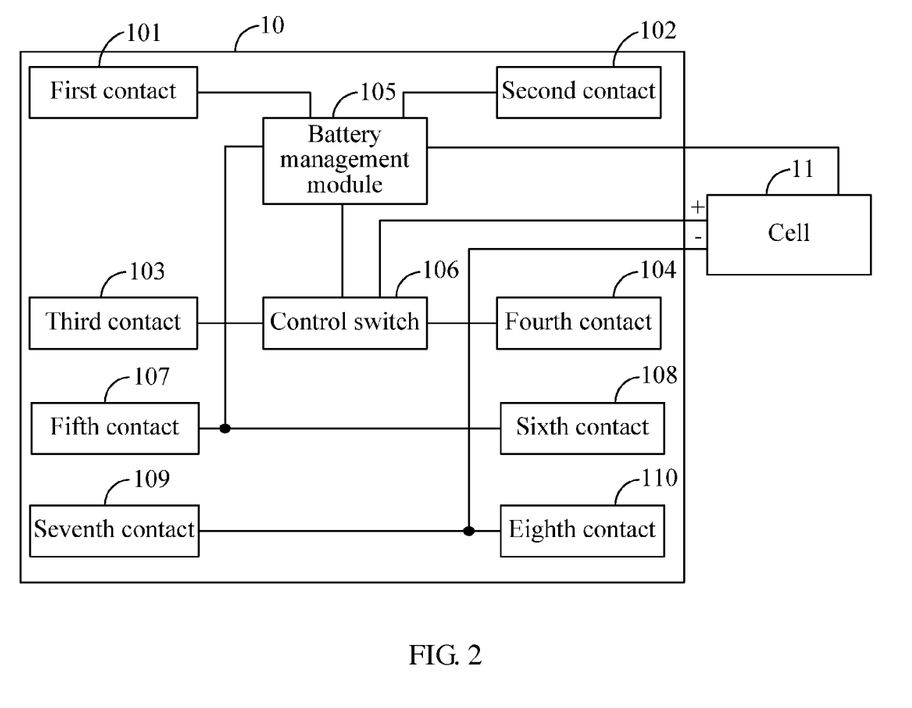
FIG. 2 is a schematic structural diagram of another embodiment of a battery according to the present invention.

Furthermore, FIG. 2 is a schematic structural diagram of another embodiment of a battery according to the present invention. As shown in FIG. 2, on the basis of the foregoing embodiments, the circuit board 10 further includes: a fifth contact 107 and a sixth contact 108. The fifth contact 107 is connected to the battery management module 105 and is electrically connected to the upper-level battery, and is configured to output a temperature of the cell in the battery; the sixth contact 108 is connected to the battery management module 105 and the fifth contact 107, and is electrically connected to the lower-level battery, and is configured to receive a temperature of a cell in the lower-level battery.

Specifically, the battery management module 105 acquires a temperature of the cell 11, so as to determine whether the cell works in a normal temperature. For example, when the temperature of the cell 11 is beyond a range of normal working temperatures of the cell 11, the battery management module 105 triggers closing of the control switch 106, so as to stop charging or discharging the cell 11; when the temperature of the cell 11 returns to the range of normal working temperatures of the cell 11, the battery management module 105 triggers opening of the control switch 106, so as to continue to charge or discharge the cell 11.

In addition, because the fifth contact is connected to the sixth contact in the upper-level battery, the battery management module 105 may transmit the temperature of the cell 11 to the upper-level battery through the sixth contact of the upper-level battery and the fifth contact; the upper-level battery may further transmit the temperature of the cell 11 to a next upper-level battery or the electricity load through the fifth contact.

Furthermore, the battery further includes: a seventh contact 109 and an eighth contact 110. The seventh contact 109 is configured to serve as a ground pin, and is connected to a cathode of the cell 11 and is electrically connected to an upper-level battery assembly; the eighth contact 110 is connected to the cathode of the cell 11 and the seventh contact 109, and is electrically connected to a lower-level battery assembly.

Figure 3:
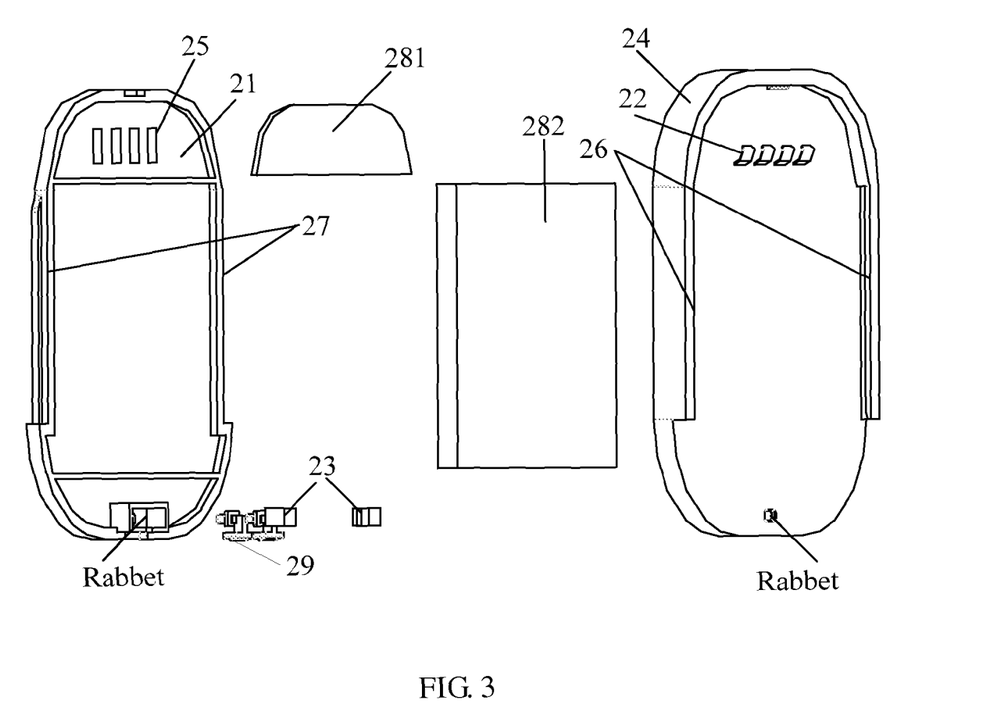
FIG. 3 is an exploded diagram of an embodiment of a battery assembly according to the present invention.

FIG. 3 is an exploded diagram of an embodiment of a battery assembly according to the present invention. As shown in FIG. 3, the battery assembly in this embodiment includes: a bottom housing 21, a first contact set 22, a fastening block 23, an upper housing 24, a second contact set 25, a first slide slot 26, a second slide slot 27, and a battery, where the battery includes a circuit board 281 and a cell 282.

Specifically, the battery may be the battery shown in the foregoing embodiments. A material of the fastening block 23 may be polyoxymethylene (POM). More specifically, as shown in FIG. 3, the fastening block 23 is disposed on a rabbet of the bottom housing 21 and is fixed together with a rabbet of the upper housing 24, so as to lock the cell and the circuit board 10 between the bottom housing 21 and the upper housing 24.

In this embodiment, taking that the battery is the battery in the embodiment shown in FIG. 2 as an example, the first contact set 22 is disposed on the upper housing 24, and includes four raised gold-plated contacts, which are connected to the foregoing second contact, fourth contact, sixth contact, and eighth contact respectively. The second contact set 25 is disposed on the bottom housing 21, and includes four recessed gold-plated contacts, which are connected to the foregoing first contact, third contact, fifth contact, and seventh contact respectively. The first slide slot 26 is disposed on the upper housing 24, the second slide slot 27 is disposed on the bottom housing 21, and the first slide slot 26 and the second slide slot 27 are complementary to each other.

It should be noted that, in this embodiment, a connection between the upper housing 24 and the bottom housing 21 and a connection between the battery assemblies may be implemented by using screws instead of the slide slots.

In this embodiment, because the first contact, the third contact, the fifth contact, and the seventh contact are charged contacts, the four recessed gold-plated contacts disposed in the second contact set 25 may effectively avoid a short circuit risk. In addition, because the first slide slot 26 and the second slide slot 27 in each battery assembly are complementary to each other, a second slide slot disposed on the bottom housing of a lower-level battery assembly may slide into a first slide slot disposed on the upper housing in an upper-level battery assembly, thereby implementing a cascade connection between the lower-level battery assembly and the upper-level battery assembly.

It should also be noted that, the first contact set 22 and the second contact set 25 correspond to each other in position, so that it may be ensured that a first contact set in the lower-level battery assembly is connected to a second contact set in the upper-level battery assembly when the lower-level battery assembly and the upper-level battery assembly are in a butt connection.

Further, in order to ensure a reliable connection between the battery assemblies and tool-free disassembly, the battery assembly may further include a lock button 29. Specifically, when the assembly needs to be connected to its lower-level battery assembly, the lock button 29 on the assembly needs to be pulled, so as to implement locking of the two levels of battery assemblies, thereby avoiding an unexpected power failure. In addition, when the lower-level battery assembly needs to be removed, the lock button 29 on the assembly may be pulled again, so that the two levels of battery assemblies come free smoothly.

In this embodiment, in the battery in the battery assembly, the battery management module disposed on the battery triggers, according to the acquired capacity of the cell in the cascaded battery behind the battery and the acquired capacity of the cell in the current battery, opening or closing of the control switch, so as to connect the third contact and the cell in the current battery or connect the third contact and the fourth contact, thereby implementing charging/discharging of the current battery or charging/discharging of a cell of any one of cascaded batteries behind the battery. In this way, problems in the prior art that a battery is not suitable to be applied to a portable and miniaturized user equipment and a switch duration is relatively long are solved, and a battery capacity may be flexibly configured according to different application scenarios of a user.

Figure 4:
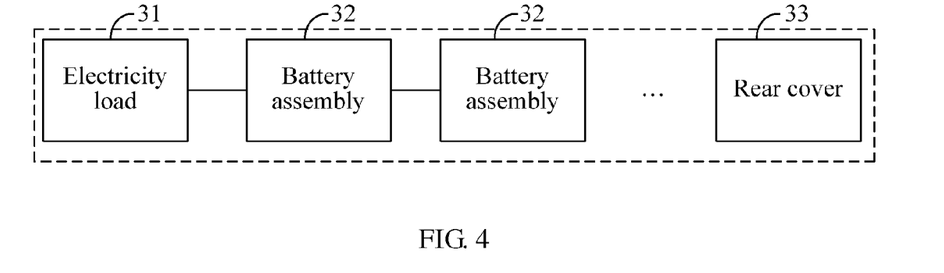
FIG. 4 is a schematic structural diagram of an embodiment of a user equipment according to the present invention.

FIG. 4 is a schematic structural diagram of an embodiment of a user equipment according to the present invention. As shown in FIG. 4, the user equipment in this embodiment includes an electricity load 31, and further includes at least one battery assembly 32, wherein the battery assembly may be the battery assembly in the embodiment shown in FIG. 3.

Further, the user equipment may further include a rear cover 33. The rear cover 33 may be used to a last-level battery assembly, so as to protect a first contact in the last-level battery assembly and additionally have a more beautiful appearance.

Furthermore, the battery assemblies 32 may be cascaded to each other in a stacking connection manner, and may further be cascaded to each other in a lengthwise connection manner.

In the embodiment, when a user does not require the user equipment to be capable of working for a long time, one battery assembly may be disposed on the user equipment; when the user requires the user equipment to be capable of working for a long time, more battery assemblies may be disposed according to specific application scenarios, so as to prolong a working duration of the user equipment.

Figure 5:
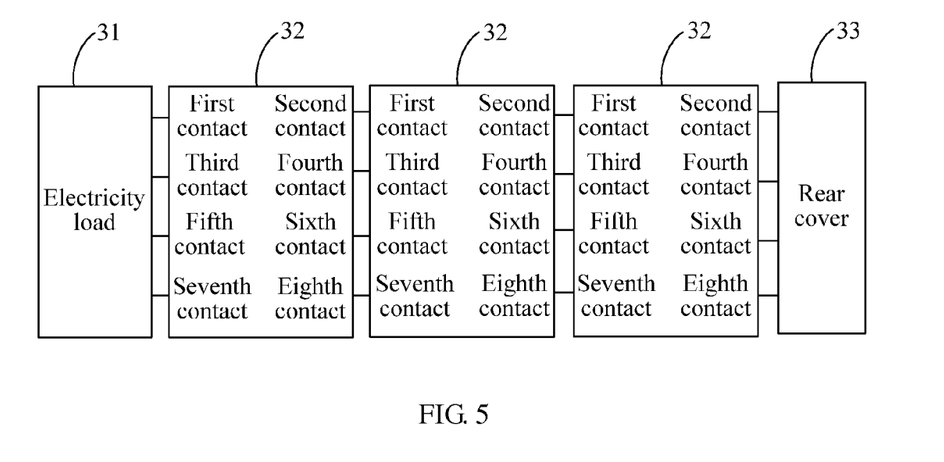
FIG. 5 is a schematic working diagram showing a cascade connection between an electricity load and three battery assemblies in a user equipment according to the present invention.
Figure 6:
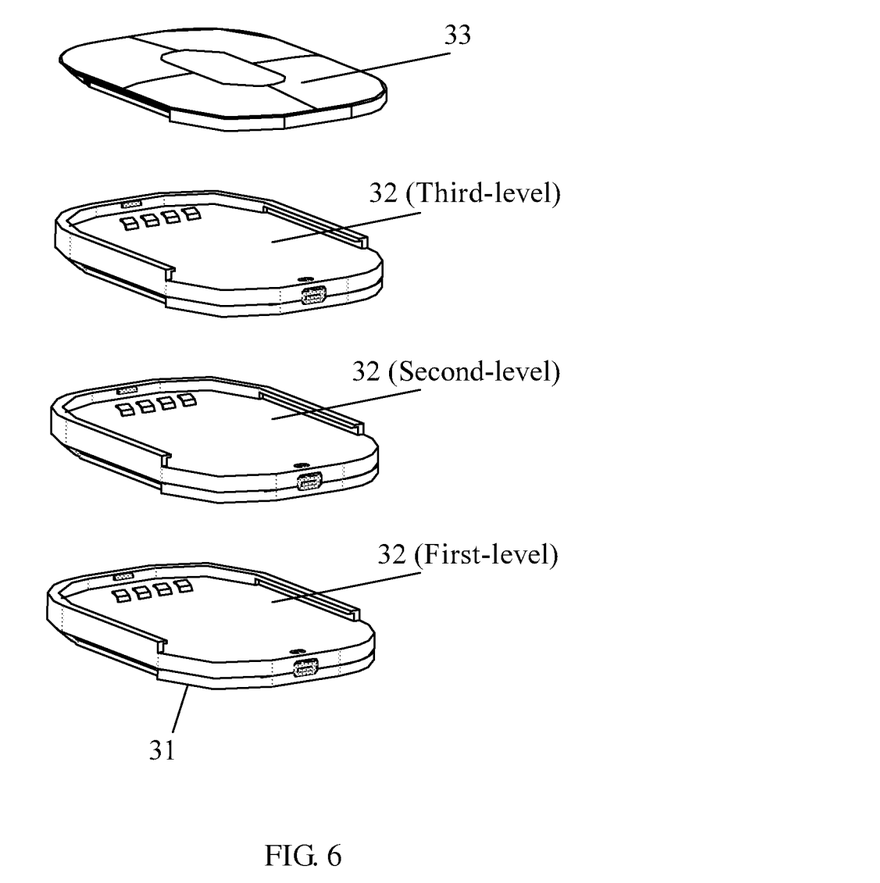
FIG. 6 is a schematic structural diagram showing a cascade connection between an electricity load and three battery assemblies in a user equipment according to the present invention.

For example, that the electricity load 31 is cascaded to three battery assemblies 32 on the user equipment and the three battery assemblies 32 are cascaded to each other in a stacking connection manner is taken as an example to introduce the technical solution of this embodiment in detail. FIG. 5 is a schematic working diagram showing a cascade connection between an electricity load 31 and three battery assemblies 32 in a user equipment according to the present invention. FIG. 6 is a schematic structural diagram showing a cascade connection between an electricity load 31 and three battery assemblies 32 in a user equipment according to the present invention. As shown in FIG. 5 and FIG. 6, a battery assembly 32 that is cascaded to the electricity load 31 may be used as a first-level battery assembly; a battery assembly 32 that is cascaded to the first-level battery assembly may be used as a second-level battery assembly; and a battery assembly 32 that is cascaded to the second-level battery assembly may be used as a third-level battery assembly. A first contact, a third contact, a fifth contact, and a seventh contact in the first-level battery assembly are electrically connected to the electricity load 31; a second contact, a fourth contact, a sixth contact, and an eighth contact in the first-level battery assembly are electrically connected to a first contact, a third contact, a fifth contact, and a seventh contact in the second-level battery assembly; the second contact, the fourth contact, the sixth contact, and the eighth contact in the second-level battery assembly are electrically connected to the first contact, the third contact, the fifth contact, and the seventh contact in the third-level battery assembly.

Figure 7A:
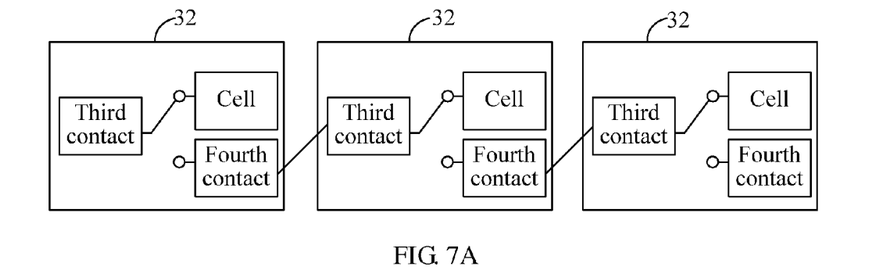
FIG. 7A, FIG. 7B, and FIG. 7C are schematic diagrams showing a working state of an embodiment of battery assemblies of three levels according to the present invention.
Figure 7B:
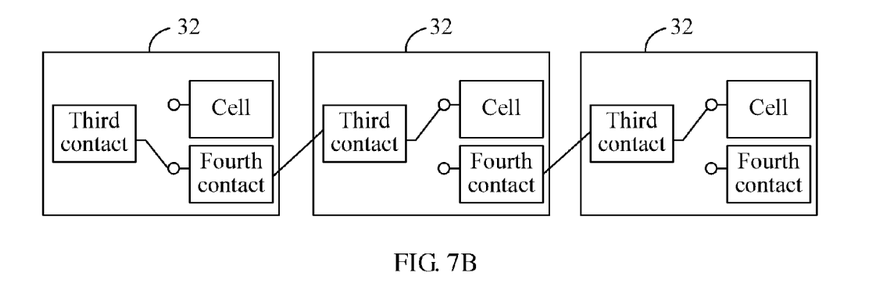
Figure 7C:
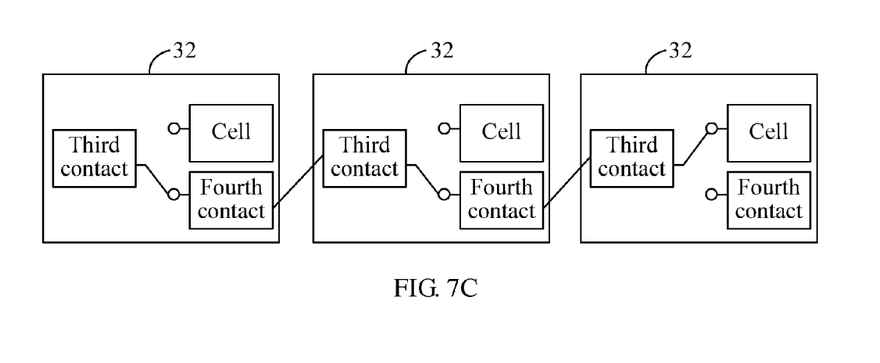

Further, FIG. 7A, FIG. 7B, and FIG. 7C are schematic diagrams showing a working state of an embodiment of battery assemblies of three levels according to the present invention. In this embodiment, that a control switch is an analog switch, and before a user equipment is used, capacities of cells in batteries in battery assemblies of three levels are sufficient is taken as an example to introduce the technical solution of this embodiment in detail. As shown in FIG. 7A, when a capacity of a cell in a battery assembly of each level is sufficient, a working principle that a battery in the battery assembly of each level in the user equipment supplies power to a electricity load is as follows: In a first-level battery assembly, when a battery management module in a battery has not detected any external charging voltage and a capacity of a cell is greater than or equal to a first preset capacity, the battery management module triggers opening of the control switch, that is, connects a third contact and the cell; in addition, in a second-level battery assembly and a third-level battery assembly, because their respective battery management modules also have not detected any external charging voltage and capacities of cells are greater than or equal to the first preset capacity, their respective battery management modules trigger opening of the control switch, that is, connect a third contact and the cell; however, because the third contact in the battery in the first-level battery assembly is not connected to a fourth contact, the second-level battery assembly and the third-level battery assembly cannot be connected to the electricity load 31; in other words, the electricity load 31 is supplied power through the battery in the first-level battery assembly at present.

As shown in FIG. 7B, in the first-level battery assembly, when the battery management module has not detected any external charging voltage, and the capacity of the cell is less than the first preset capacity and the battery management module acquires a capacity of a cell in a battery in a lower-level battery assembly (that is, the second-level battery assembly), the battery management module triggers closing of the control switch, that is, connects the third contact and the fourth contact. Meanwhile, because in the second-level battery assembly, the third contact in the battery is connected to the cell, the battery in the second-level battery assembly supplies power to the electricity load 31.

As shown in FIG. 7C, in the second-level battery assembly, when the battery management module has not detected any external charging voltage, the capacity of the cell is less than the first preset capacity and the battery management module acquires a capacity of a cell in a battery in a lower-level battery assembly (that is, the third-level battery assembly), the battery management module triggers closing of the control switch, that is, connects the third contact and the fourth contact. Meanwhile, because in the third-level battery assembly, the third contact in the battery is connected to the cell, the battery in the third-level battery assembly supplies power to the electricity load 31.

Furthermore, in the third-level battery assembly, when the battery management module determines that the capacity of the cell is less than the first preset capacity, and a second contact does not receive the capacity of the cell in the battery in the lower-level battery assembly, it indicates that the lower-level battery assembly does not exist, that is, the current level of battery assembly is the last-level of battery assembly; then, the third-level battery assembly sends a battery depletion signal to a second contact in the second-level battery assembly through a first contact, and then, the first contact in the second-level battery assembly forwards the battery depletion signal to a second contact in the first-level battery assembly, and finally, the first contact in the first-level battery assembly transmits the battery depletion signal to the electricity load 31, so that the user equipment knows that the capacities of the cells in the batteries in all the battery assemblies have run out, thereby performing an automatic shutdown operation.

Figure 8A:
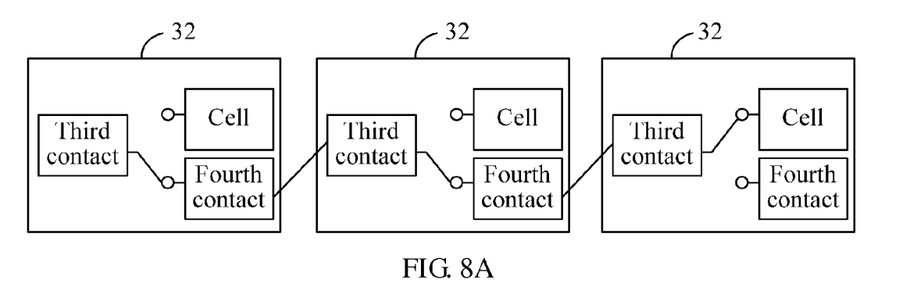
FIG. 8A, FIGS. 8B, and 8C are schematic diagrams showing a working state of another embodiment of battery assemblies of three levels according to the present invention.
Figure 8B:
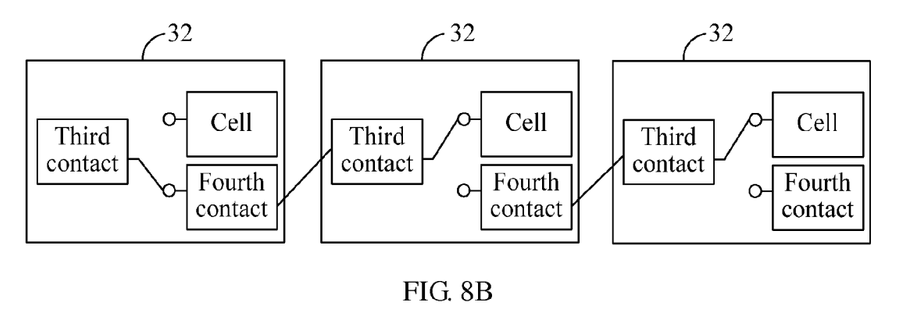
Figure 8C:
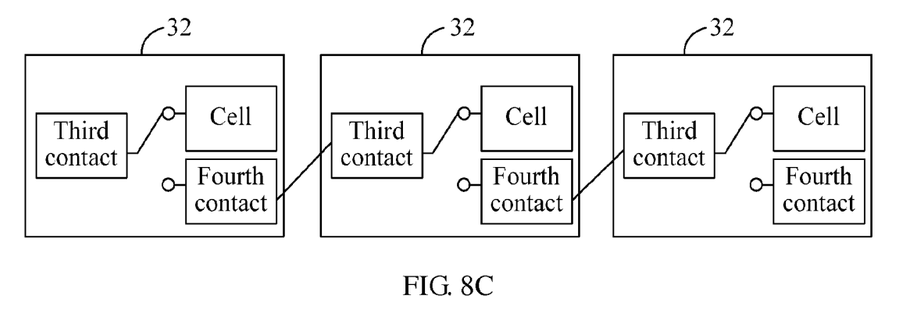

Furthermore, FIG. 8A, FIG. 8b, and FIG. 8C are schematic diagrams showing a working state of another embodiment of battery assemblies of three levels according to the present invention. In this embodiment, that a control switch is an analog switch, and capacities of cells in batteries in battery assemblies of three levels in a user equipment are insufficient, that is, the cells need to be charged is taken as an example to introduce the technical solution of this embodiment in detail. As shown in FIG. 8A, when the user equipment is charged, a working principle of charging a battery in a battery assembly of each level in the user equipment is as follows: In a third-level battery assembly, when a battery management module in a battery has detected an external charging voltage and a capacity of a cell is less than a second preset capacity, the battery management module triggers opening of the control switch, that is, connects a third contact and the cell; in addition, in a first-level battery assembly and a second-level battery assembly, because their respective battery management modules also have detected an external charging voltage and determine that a capacity of a cell in a battery in each lower-level battery assembly is less than the second preset capacity, their respective battery management modules trigger closing of the control switch, that is, connect a third contact and a fourth contact; in this case, because the third contact of a battery in the first-level battery assembly is connected to the fourth contact, the third contact of a battery in the second-level battery assembly is connected to the fourth contact, and the third contact of the battery in the third-level battery assembly is connected to the cell, the battery in the third-level battery assembly may be charged preferentially.

As shown in FIG. 8B, in the third-level battery assembly, when the battery management module has detected the external charging voltage and the capacity of the cell is greater than or equal to the second preset capacity, the battery management module sends a charging completion signal to a battery management module in a battery in the second-level battery assembly through the first contact in the third-level. After receiving the charging completion signal, the battery management module in the second-level battery assembly triggers opening of the control switch, that is, connects the third contact and the cell. Because the capacity of the cell is less than the second preset capacity in this case and the charging completion signal is received, it is determined that the capacity of the cell in the battery in the third-level battery assembly is greater than or equal to the second preset value, and then the battery in the second-level battery assembly may be charged.

As shown in FIG. 8C, in the second-level battery assembly, when the battery management module has detected the external charging voltage and the capacity of the cell is greater than or equal to the second preset capacity, the battery management module sends a charging completion signal to the battery management module in the battery in the first-level battery assembly through a first contact. After receiving the charging completion signal, the battery management module in the first-level battery assembly triggers opening of the control switch, that is, connects the third contact and the cell. Because the capacity of the cell is less than the second preset capacity in this case and the charging completion signal is received, it is determined that the capacity of the cell in the battery in the second-level battery assembly is greater than or equal to the second preset value, and then the battery in the first-level battery assembly may be charged. In addition, it should be noted that, in the first-level battery assembly, when determining that the capacity of the cell is greater than or equal to the second preset value, the battery management module sends a charging completion signal to an electricity load 31 through the first contact, so that the electricity load 31 considers that charging of the batteries in all the battery assemblies is completed.

In this embodiment, when the user equipment works, the battery assembly of each level may be controlled in a distributed manner, that is, a battery management module in a battery in the battery assembly of each level implements a connection between a third contact and a cell or a connection between a third contact and a fourth contact by determining a capacity of its cell and a capacity of a cell in a battery in a lower-level battery assembly. Meanwhile, the battery in the battery assembly of each level works independently, and its cell supplies power neither in parallel nor in series, so that it is more beneficial to protection of the cell. Furthermore, it is effectively implemented that the battery in the battery assembly of each level in the user equipment is quickly switched, and charging and discharging are performed much more intelligently.

Persons of ordinary skill in the art may understand that all or part of the steps of the foregoing method embodiments may be implemented by a program instructing relevant hardware. The program may be stored in a computer readable storage medium. When the program is run, the steps of the foregoing method embodiments are performed. The storage medium may be any medium capable of storing program codes, such as a read-only memory (ROM), a random-access memory (RAM), a magnetic disk, or an optical disk.

Finally, it should be noted that the foregoing embodiments are merely intended for describing the technical solutions of the present invention rather than limiting the present invention. Although the present invention is described in detail with reference to the foregoing embodiments, persons of ordinary skill in the art should understand that they may still make modifications to the technical solutions described in the foregoing embodiments or make equivalent replacements to part of technical features of the technical solutions described in the foregoing embodiments; however, these modifications or replacements do not make the essence of the corresponding technical solutions depart from the spirit and scope of the technical solutions of the embodiments of the present invention.

What is claimed is:

1. A battery comprising:
   a cell; and
   a circuit board comprising a first contact, a second contact, a third contact, a fourth contact, a battery management module, and a control switch,
   wherein the first contact is connected to the battery management module and is electrically connected to an upper-level battery or is connected to an electricity load,
   wherein the first contact is configured to report a capacity of the cell in the battery or report the capacity of the cell in the battery and a capacity of a cell in a cascaded battery behind the battery to the upper-level battery or the electricity load,
   wherein the second contact is connected to the battery management module and is electrically connected to a lower-level battery,
   wherein the second contact is configured to receive the capacity of the cell in the cascaded battery behind the battery and output the capacity of the cell in the cascaded battery behind the battery to the battery management module,
   wherein the third contact is connected to the upper-level battery or the electricity load,
   wherein the third contact is configured to, when the control switch is opened, connect to the cell in the battery to charge or discharge the cell in the battery,
   wherein the fourth contact is connected to the lower-level battery and is configured to, when the control switch is closed, connect to the third contact such that the lower-level battery performs corresponding processing,
   wherein the battery management module is connected to the cell, the first contact, the second contact, and the control switch in the battery, and
   wherein the battery management module is configured to trigger, according to at least one of the capacity of the cell in the battery and the capacity of the cell in the cascaded battery behind the battery, opening or closing of the control switch.

2. The battery according to claim 1, wherein the battery management module is configured to trigger the opening of the control switch by:
   triggering opening of the control switch when the battery management module has not detected any external charging voltage and when it is determined that the capacity of the cell in the battery is greater than or equal to a first preset capacity; or
   triggering opening of the control switch when the battery management module has detected an external charging voltage and when it is determined that the capacity of the cell in the battery is less than a second preset capacity and capacities of cells in cascaded batteries behind the battery are all greater than or equal to the second preset capacity.

3. The battery according to claim 2, wherein the battery management module is configured to trigger the closing of the control switch by:
   triggering closing of the control switch when the battery management module has not detected any external charging voltage, when it is determined that the capacity of the cell in the battery is less than or equal to the first preset capacity, and when the battery management module receives the capacity of the cell in the cascaded battery behind the battery; or
   trigger closing of the control switch when the battery management module has detected the external charging voltage and when it is determined that a capacity of a cell in one or more cascaded batteries behind the battery is less than the second preset capacity.

4. The battery according to claim 1, wherein the battery management module is further configured to output a battery depletion signal through the first contact such that a user equipment performs a shutdown operation when no external charging voltage has been detected, when it is determined that the capacity of the cell in the battery is less than a first preset capacity, and when the capacity of the cell in the cascaded battery behind the battery is not received.

5. The battery according to claim 1, wherein the battery management module is further configured to:
   output a charging completion signal to the upper-level battery through the first contact to disconnect the upper-level battery and the battery when an external charging voltage has been detected and when it is determined that the capacity of the cell in the battery is greater than or equal to a second preset capacity; or
   output the charging completion signal to a user equipment through the first contact when the external charging voltage has been detected and when it is determined that the capacity of the cell in the battery is greater than or equal to the second preset capacity.

6. The battery according to claim 1, wherein the circuit board further comprises:
   a fifth contact connected to the battery management module and electrically connected to the upper-level battery, wherein the fifth contact is configured to output a temperature of the cell in the battery; and
   a sixth contact connected to the battery management module, connected to the fifth contact, and electrically connected to the lower-level battery, wherein the sixth contact is configured to receive a temperature of a cell in the lower-level battery, and wherein the battery management module acquires the temperature of the cell to determine whether the cell functions at a normal temperature.

7. The battery according to claim 6, wherein the circuit board further comprises:
a seventh contact connected to a cathode of the cell in the battery, and electrically connected to the upper-level battery, wherein the seventh contact is configured to serve as a ground pin; and
an eighth contact connected to the cathode of the cell in the battery, connected to the seventh contact, and electrically connected to the lower-level battery.

8. A battery assembly comprising:
a bottom housing;
an upper housing coupled to the bottom housing, wherein the upper housing and the bottom housing form a cavity for housing a battery;
a first contact set disposed on the upper housing;
a fastening block;
a second contact set disposed on the bottom housing;
a first slide slot disposed on the upper housing; and
a second slide slot disposed on the bottom housing,
wherein the first slide slot and the second slide slot are complementary to each other,
wherein the first contact set comprises four raised contacts, wherein the four raised contacts are connected to a second contact, a fourth contact, a sixth contact, and an eighth contact of the battery, respectively,
wherein the second contact set comprises four recessed contacts, wherein the four recessed contacts are connected to a first contact, a third contact, a fifth contact, and a seventh contact of the battery respectively, and
wherein the battery comprises a battery management module and a control switch, wherein the battery management module controls opening and closing of the control switch based on a battery capacity of the battery, and wherein the control switch controls charging or discharging of the battery.

9. The battery assembly according to claim 8, further comprising a lock button configured to lock the battery assembly and a lower-level battery assembly connected to the battery assembly together.

10. A user equipment comprising:
an electricity load;
a circuit board comprising a battery management module and a control switch;
at least one battery assembly comprising:
a bottom housing;
an upper housing coupled to the bottom housing, wherein the upper housing and the bottom housing form a cavity for housing a battery;
a first contact set disposed on the upper housing;
a fastening block;
a second contact set disposed on the bottom housing;
a first slide slot disposed on the upper housing; and
a second slide slot disposed on the bottom housing,
wherein the first slide slot and the second slide slot are complementary to each other,
wherein the first contact set comprises four raised contacts, wherein the four raised contacts are connected to a second contact, a fourth contact, a sixth contact, and an eighth contact of the battery, respectively,
wherein the second contact set comprises four recessed contacts, wherein the four recessed contacts are connected to a first contact, a third contact, a fifth contact, and a seventh contact of the battery, respectively,
wherein the battery management module controls opening and closing of the control switch based on a battery capacity of the battery, and
wherein the control switch controls charging or discharging of the battery.

11. The user equipment according to claim 10, further comprising a rear battery cover, and wherein the rear battery cover is disposed with a third slide slot, which is complementary to the first slide slot.

12. The user equipment according to claim 11, wherein a plurality of battery assemblies are cascaded to each other in a stacking connection manner.

13. The user equipment according to claim 11, wherein a plurality of battery assemblies are cascaded to each other in a lengthwise connection manner.

14. The user equipment according to claim 10, wherein a plurality of battery assemblies are cascaded to each other in a stacking connection manner.

15. The user equipment according to claim 10, wherein a plurality of battery assemblies are cascaded to each other in a lengthwise connection manner.

* * * * *